(12) United States Patent
Hu et al.

(10) Patent No.: US 12,063,842 B2
(45) Date of Patent: Aug. 13, 2024

(54) ORGANIC LIGHT EMITTING DIODE PANEL AND OLED LIGHT EMITTING DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Hungchieh Hu, Beijing (CN); Pohsien Wu, Beijing (CN); Yuhsiung Feng, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 649 days.

(21) Appl. No.: 17/271,193

(22) PCT Filed: Jun. 17, 2020

(86) PCT No.: PCT/CN2020/096557
§ 371 (c)(1),
(2) Date: Feb. 24, 2021

(87) PCT Pub. No.: WO2020/253718
PCT Pub. Date: Dec. 24, 2020

(65) Prior Publication Data
US 2021/0335894 A1  Oct. 28, 2021

(30) Foreign Application Priority Data

Jun. 21, 2019 (CN) .......................... 201910544318.9

(51) Int. Cl.
*H10K 59/84* (2023.01)
*H10K 50/854* (2023.01)

(52) U.S. Cl.
CPC .......... *H10K 59/84* (2023.02); *H10K 50/854* (2023.02)

(58) Field of Classification Search
CPC ........................... H10K 59/84; H10K 50/854
See application file for complete search history.

(56) References Cited

U.S. PATENT DOCUMENTS

| 7,379,081 B2 | 5/2008 | Park et al. |
| 2006/0232183 A1 | 10/2006 | Park et al. |

(Continued)

FOREIGN PATENT DOCUMENTS

| CN | 1848218 A | 10/2006 |
| CN | 101025893 A | 8/2007 |

(Continued)

OTHER PUBLICATIONS

First Chinese Office Action dated Dec. 25, 2020, received for corresponding Chinese Application No. 201910544318.9, 16 pages.

(Continued)

*Primary Examiner* — Robert J Michaud
(74) *Attorney, Agent, or Firm* — Kinney & Lange, P.A.

(57) ABSTRACT

The present disclosure relates to an organic light emitting diode panel and an OLED light emitting device. The organic light emitting diode panel includes: a substrate; a plurality of organic light emitting diodes located on the substrate, wherein emission colors of the plurality of organic light emitting diodes are not completely the same, and each organic light emitting diode includes a first electrode and a second electrode. The same voltage is applied to the first electrodes of organic light emitting diodes of different emission colors, the same voltage is applied to the second electrodes of organic light emitting diodes of the same (Continued)

emission color, and different voltages are applied to the second electrodes of the organic emission diodes of different emission colors.

18 Claims, 3 Drawing Sheets

(56) References Cited

U.S. PATENT DOCUMENTS

| | | | | |
|---|---|---|---|---|
| 2014/0231793 | A1* | 8/2014 | Rajan | H05K 1/147 |
| | | | | 257/40 |
| 2016/0172330 | A1 | 6/2016 | Hack et al. | |
| 2016/0275910 | A1 | 9/2016 | Lee et al. | |
| 2016/0357081 | A1* | 12/2016 | Li | H01L 27/1262 |
| 2016/0380238 | A1* | 12/2016 | Ma | H10K 50/858 |
| | | | | 257/40 |
| 2020/0320925 | A1* | 10/2020 | Luo | G09G 3/32 |
| 2021/0209991 | A1* | 7/2021 | Rügheimer | G09G 3/2003 |
| 2021/0217821 | A1 | 7/2021 | Han et al. | |
| 2021/0327972 | A1* | 10/2021 | Lou | H10K 59/353 |

FOREIGN PATENT DOCUMENTS

| | | |
|---|---|---|
| CN | 103928498 A | 7/2014 |
| CN | 107452783 A | 12/2017 |
| CN | 107819023 A | 3/2018 |
| CN | 108109579 A | 6/2018 |
| CN | 110224015 A | 9/2019 |
| CN | 110767720 A | 2/2020 |
| IN | 109584794 A | 4/2019 |

OTHER PUBLICATIONS

Second Chinese Office Action dated Jul. 28, 2021, received for corresponding Chinese Application No. 201910544318.9, 13 pages.
Jiang Quan et al., "Flat Panel Display Drive Technology", National Defense Industry Press, pp. 60-61, Aug. 2014.

* cited by examiner

ORGANIC LIGHT EMITTING DIODE PANEL AND OLED LIGHT EMITTING DEVICE

CROSS-REFERENCE TO RELATED APPLICATION

This application is a Section 371 National Stage Application of International Application No. PCT/CN2020/096557, filed Jun. 17, 2020, entitled "ORGANIC LIGHT EMITTING DIODE PANEL AND OLED LIGHT EMITTING DEVICE" which claims priority to the Chinese Patent Application No. 201910544318.9 filed on Jun. 21, 2019, the disclosures of which are incorporated herein by reference.

TECHNICAL FIELD

The present disclosure relates to the field of lighting and display, and in particular to an organic light emitting diode panel and an OLED light emitting device.

BACKGROUND

With the development of OLED technology, organic light emitting diodes are used to prepare various lighting devices. Since an organic light emitting diode has characteristics of self-luminescence and may be prepared on a flexible substrate, a lighting device based on the organic light emitting diode has a greater degree of freedom in design. It may be formed into a flat rigid, foldable and bendable light emitting device, and a thickness and weight of the light emitting device may be greatly reduced. Although the light emitting device based on the organic light emitting diode has many advantages, the current light emitting device that may achieve color-tunable light emission still generally has disadvantages such as a complex structure and a large device thickness. Therefore, the organic light emitting diode panel and the OLED light emitting device still need to be improved.

SUMMARY

According to one aspect of the present disclosure, there is provided an organic light emitting diode panel, including: a substrate; a plurality of organic light emitting diodes located on the substrate, wherein emission colors of the plurality of organic light emitting diodes are not completely the same, and each organic light emitting diode includes a first electrode and a second electrode; wherein the same voltage is applied to the first electrodes of organic light emitting diodes of different emission colors, the same voltage is applied to the second electrodes of organic light emitting diodes of the same emission color, and different voltages are applied to the second electrodes of the organic light emitting diodes of different emission colors.

In some embodiments, the second electrodes of the organic light emitting diodes of the same emission color are connected to a voltage controller through the same wire.

In some embodiments, the substrate is divided into a plurality of light emitting areas, and the second electrodes of a plurality of organic light emitting diodes located in the same light emitting area and having the same emission color are connected to a voltage controller through the same wire.

In some embodiments, the organic light emitting diode panel further includes a plurality of wires connected to the second electrodes of the organic light emitting diodes, and the second electrodes and the wires are connected in a one-to-one correspondence.

In some embodiments, the organic light emitting diode panel includes a plurality of light emitting units which are the same, each light emitting unit comprise multiple organic light emitting diodes which are located on the same straight line, and emission colors of which are not completely the same.

In some embodiments, the plurality of light emitting units are arranged in multiple rows or multiple columns on the substrate.

In some embodiments, the plurality of light emitting units are arranged in an array on the substrate, and the organic light emitting diodes of two of the light emitting units located in two adjacent rows are arranged by staggering one light emitting diode in a row direction.

In some embodiments, the organic light emitting diode panel further includes: a scattering film located on a light exit side of the organic light emitting diode panel.

In some embodiments, the organic light emitting diode panel further includes a plurality of wires and a plurality of connection ports, wherein the connection ports are located at an edge of the substrate and are electrically connected to the first electrodes and the second electrodes of the organic light emitting diodes respectively through the wires, so as to apply voltages to the first electrodes and the second electrodes of the organic light emitting diodes through the connection ports.

In some embodiments, at least two buffer layers are provided between the substrate and the organic light emitting diodes, the plurality of wires are distributed in the at least two buffer layers and are respectively connected to the first electrodes and the second electrodes of the organic light emitting diodes through via holes.

In some embodiments, a planarization layer is provided between the scattering film and the organic light emitting diodes.

In some embodiments, the first electrode is a cathode of the organic light emitting diode, and the second electrode is an anode of the organic light emitting diode.

In some embodiments, the plurality of organic light emitting diodes have the same shape and are arranged in a row, and a shape of each organic light emitting diode is a rectangle shape with a long side perpendicular to a extending direction of the row, or is a parallelogram.

In some embodiments, the plurality of organic light emitting diodes have the same shape and are arranged in an array, and a shape of each organic light emitting diode is a rectangle, rhombus, triangle or circle.

According to another aspect of the present disclosure, there is provided an OLED light emitting device, including: a housing including a frame and a transparent lampshade that define an accommodation space; and the above-mentioned organic light emitting diode panel, wherein the organic light emitting diode panel is housed in the accommodation space, and a light exit side of the organic light emitting diode panel is arranged toward the lampshade.

BRIEF DESCRIPTION OF THE DRAWINGS

The above and/or additional aspects and advantages of the present disclosure will become apparent and easy to understand from the following description of the embodiments in conjunction with the drawings.

DETAILED DESCRIPTION OF EMBODIMENTS

Figure 1:
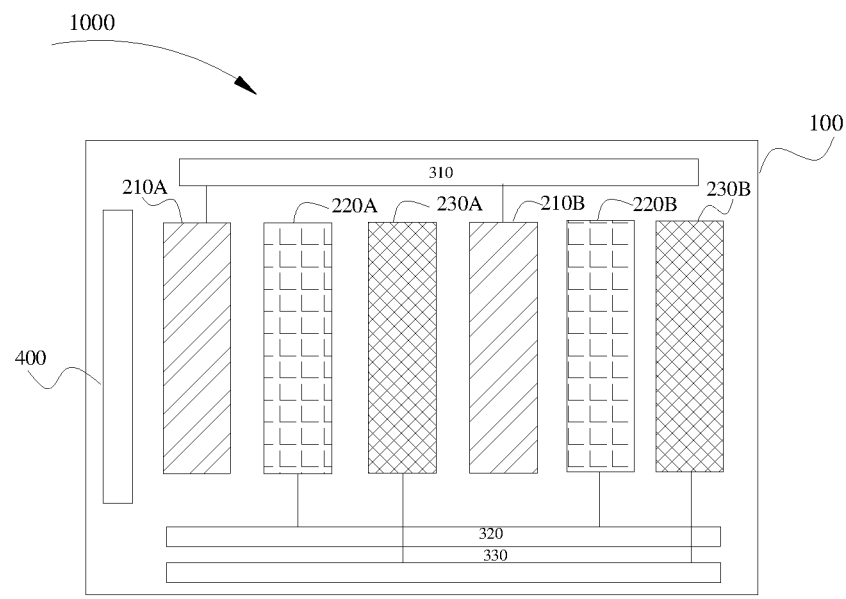
FIG. 1 shows a schematic structural diagram of an organic light emitting diode panel according to an embodiment of the present disclosure, which includes a plurality of bar-shaped organic light emitting diodes arranged in a row, and each organic light emitting diode has a rectangular shape.

The embodiments of the present disclosure are described in detail below. Examples of the embodiments are shown in the drawings, in which the same or similar reference numerals indicate the same or similar elements or elements having the same or similar functions throughout. The embodiments described below with reference to the drawings are exemplary for explaining the present disclosure, and should not be construed as limiting the present disclosure.

According to one aspect of the present disclosure, an organic light emitting diode panel is proposed. With reference to FIG. 1, the organic light emitting diode panel includes a substrate 100 and a plurality of organic light emitting diodes (210A-230B as shown). The plurality of organic light emitting diodes are located on the substrate, and emission colors of the plurality of organic light emitting diodes are not completely the same. For example, the plurality of organic light emitting diodes may include organic light emitting diodes that respectively emit red, green, blue, yellow or white light. Each color of light may correspond a plurality of organic light emitting diodes. That is, a plurality of organic light emitting diodes that emit red light, a plurality of organic light emitting diodes that emit green light, and so on may be provided on the substrate 100. For the plurality of organic light emitting diodes, each of the plurality of organic light emitting diodes has a first electrode, a second electrode, and a light emitting layer interposed between the first electrode and the second electrode. The first electrode and the second electrode are connected to an external circuit, so that the external circuit applies a voltage to the first electrode and the second electrode to cause the light emitting layer to emit light. For example, in the structure shown in FIG. 1, the organic light emitting diode panel may include organic light emitting diodes of three emission colors. The plurality of organic light emitting diodes are configured so that the same voltage is applied to the first electrodes of the plurality of organic light emitting diodes on the substrate 100, and the same voltage is applied to the second electrodes of organic light emitting diodes of the same emission color. In this way, the organic light emitting diode panel may control the organic light emitting diodes of different emission colors to respectively emit light, thereby controlling the color of the mixed light emitted by the panel. The panel has the advantages of a simple structure, a light and thin volume, and a flexibly tunable emission color.

For ease of understanding, the following briefly describes the principle that the organic light emitting diode panel according to the embodiments of the present disclosure may achieve the above-mentioned beneficial effects.

In the current organic light emitting diode panel, especially the organic light emitting diode panel used for lighting, multi-color light emission is usually achieved by attaching light emitting panels of two emission colors to each other, the light emitting panel on the light exit side being a transparent panel, so as to achieve a color tunable panel. However, the structure of the above-mentioned panel is relatively complicated, and the manner of attaching multiple panels to each other significantly increases an overall thickness of the organic light emitting diode panel. In the organic light emitting diode panel according to the embodiments of the present disclosure, the same voltage may be applied to the first electrodes of the plurality of organic light emitting diodes located on the substrate 100, and the same voltage may be applied to the second electrodes of the organic light emitting diodes of the same emission color. Therefore, the organic light emitting diodes of the same emission color of the organic light emitting diode panel according to the embodiments of the present disclosure may be turned on or off at the same time, and a plurality of organic light emitting diodes of different emission colors may be independently controlled without interfering with each other. Therefore, the color of the mixed light emitted by the light emitting panel may be controlled by controlling the light emitting diodes of different colors to emit light at the same time or not emit light at the same time, so that the emission color of the light emitting panel is flexibly tunable. In addition, since the light emitting panel achieves the tunable color through the second electrodes of the organic light emitting diodes of different emission colors, there is no need to increase the thickness of the panel.

According to the embodiments of the present disclosure, there is no particular limit to the specific manner of controlling that the same voltage is applied to the first electrodes of the plurality of organic light emitting diodes and the same voltage is applied to the second electrodes of the organic light emitting diodes of the same emission color, which may be designed by those skilled in the art according to actual conditions. For example, wires and connection ports may be arranged so that the first electrodes (for example, cathodes) of the plurality of organic light emitting diodes are all connected to the same common connection port, and the second electrodes (for example, anodes) of the organic light emitting diodes of the same emission color are connected to the same connection port. In this way, the same voltage may be applied to the cathodes of all the organic light emitting diodes on the substrate 100 through the same common port. Furthermore, since the anodes of the plurality of organic light emitting diodes of the same emission color are all connected to the same connection port, and the anodes of the light emitting colors of different emission colors are connected to different connection ports, the voltage applied to the anodes of the organic light emitting diodes of the same emission color on the substrate 100 may be controlled through the ports. For example, in the structure shown in FIG. 1, organic light emitting diodes of three emission colors (which may be red, green and blue), that is, first organic light emitting diodes 210, second organic light emitting diodes 220 and third organic light emitting diodes 230, are arranged on the substrate 100. The first electrodes of all the organic light emitting diodes may be connected to a first connection port 400, and the second electrodes of a plurality of first organic light emitting diodes (for example, 210A and 210B as shown) of the same emission color may be connected to a second connection port 310. Similarly, the second electrodes of a plurality of organic light emitting diodes (for example, 220A and 220B as shown) of the same emission color may be connected to a third connection port 320, and the second electrodes of a plurality of third organic light emitting diodes (for example, 230A and 230B as shown) of the same emission color may be connected to a fourth connection port 330. Those skilled in the art may understand that, for the current organic light emitting diode panel, it is also necessary to connect the organic light emitting diode to an external circuit (such as a voltage controller) through structures such as wires and connection ports. Therefore, the above structure of the present disclosure does not additionally increase electronic components or structures on the substrate 100.

According to the embodiments of the present disclosure, the connection port may be located at an edge of the substrate 100. Taking the structure shown in FIG. 1 as an example, the first connection port 400, which is the common port connected to the first electrodes, may be located at an edge of one side of the substrate 100, and the second connection port 310 connected to the second electrodes may be located on another side of the substrate 100 (for example, an edge in a long side direction), the third connection port 320 and the fourth connection port 330 may be located at an edge of the same side of the substrate 100, for example, the edge of the side opposite to the second connection port 310. This is advantageous to achieve the connection between the connection ports and the external circuit at the edges of the substrate 100.

Figure 2:
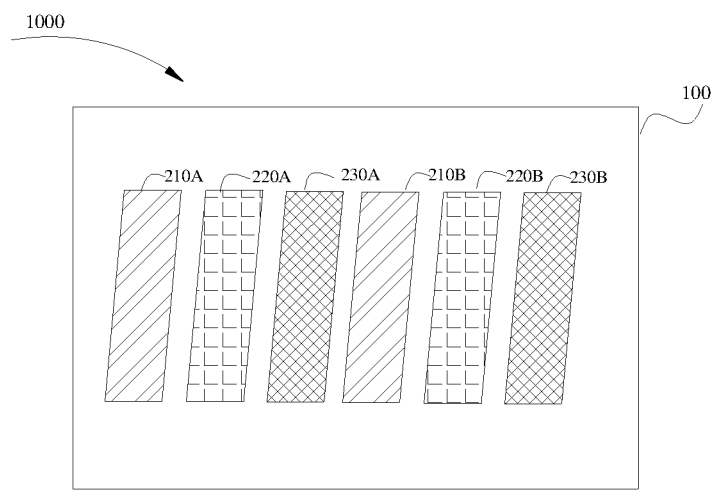
FIG. 2 shows a partial structural diagram of an organic light emitting diode panel according to an embodiment of the present disclosure, which includes a plurality of bar-shaped organic light emitting diodes arranged in a row, and each organic light emitting diode has a parallelogram shape.
Figure 3:
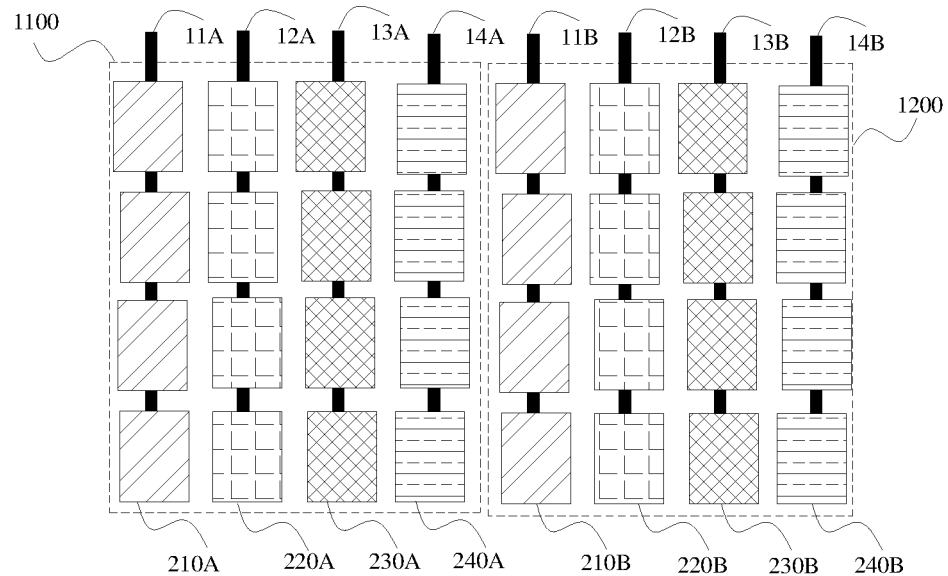
FIG. 3 shows a partial structural diagram of an organic light emitting diode panel according to another embodiment of the present disclosure, which includes a plurality of organic light emitting diodes arranged in an array.

According to the embodiments of the present disclosure, the number, emission color, shape and arrangement of the plurality of organic light emitting diodes on the substrate 100 are not particularly limited, and those skilled in the art may make selections according to actual conditions. For example, referring to FIG. 1 and FIG. 2, the plurality of organic light emitting diodes may all be bar-shaped, and a length of the bar shape may be a length of the light emitting area of the organic light emitting diode panel. That is, a plurality of bar-shaped organic light emitting diodes arranged in a row may be provided on the substrate 100. The shape of each organic light emitting diode may be a rectangle shown in FIG. 1, or a shape shown in FIG. 2 with a certain inclination angle, similar to a parallelogram. Alternatively, the plurality of organic light emitting diodes may be arranged in an array. Referring to FIG. 3, a plurality of organic light emitting diodes may be arranged in multiple rows and multiple columns. The specific shape of each organic light emitting diode is not particularly limited, which may be a rectangular, rhombus, triangle, circle, and so on.

According to some specific embodiments of the present disclosure, the first electrodes of the plurality of organic light emitting diodes on the substrate 100 may all be connected to the same connection port, such as the first connection port 400 shown in FIG. 1. The first electrode of each organic light emitting diode may be connected to the first connection port 400 through a wire. Alternatively, the first electrodes of some of the plurality of organic light emitting diodes may be connected to each other through respective wires, and finally connected to the first connection port 400 through a wire. Similarly, the second electrodes of the plurality of organic light emitting diodes of the same emission color may also be connected to the connection port through respective wires.

According to some embodiments of the present disclosure, the advantage of providing the plurality of organic light emitting diodes on the substrate 100 and providing more than one organic light emitting diodes for each emission color is that when a certain organic light emitting diode is damaged and fails to emit light, the other organic light emitting diode(s) of the same emission color may continue to work, so that the organic light emitting diode panel may still work normally. The more the organic light emitting diodes are provided on the substrate 100, the smaller the impact is produced on the overall light emitting effect of the panel when a single organic light emitting diode is damaged. However, the more the organic light emitting diodes, the higher the production costs. Therefore, the specific number of the organic light emitting diodes may be designed according to a size of the organic light emitting diode panel and the requirements for light emission.

According to the embodiments of the present disclosure, in the case where the second electrodes of all the organic light emitting diodes of the same emission color are connected to each other and then to the same connection port, it is equivalent to that the second electrodes of all the organic light emitting diodes are all connected in series. Therefore, when a certain organic light emitting diode is damaged, the serial connection line also fails. In order to prevent this case, referring to FIG. 3, the substrate 100 may be divided into a plurality of light emitting areas, such as a first light emitting area 1100 and a second light emitting area 1200 as shown. The second electrodes of a plurality of organic light emitting diodes located in the same light emitting area and having the same emission color are connected to the voltage controller through the same wire. In this way, the performance of the organic light emitting diode panel may be further improved. For example, referring to FIG. 3, the panel may include organic light emitting diodes (such as first organic light emitting diodes 210, second organic light emitting diodes 220, third organic light emitting diodes 230 and fourth organic light emitting diodes 240) of four emission colors (such as red, green, blue and yellow). The plurality of organic light emitting diodes are arranged in an array, and the organic light emitting diodes of the same emission color are arranged in the same column. The second electrodes of the plurality of first organic light emitting diodes 210 located in the same light emitting area may be connected in series, and then connected to the same connection port through a common first wire 11A. The first light emitting diodes located in different light emitting areas are connected to the same connection port through different wires. In other words, the second electrodes of the plurality of first organic light emitting diodes 210A located in the first light emitting area 1100 may be connected in series by the first wire 11A, and the second electrodes of the plurality of first organic light emitting diodes 210B located in the second light emitting area 1200 may be connected in series by the first wire 11B. The first wire 11A and the first wire 11B may be connected to the same connection port. Similarly, the second wires 12 (such as 12A and 12B shown) may connect the second electrodes of the plurality of second organic light emitting diodes located in the first light emitting area 1100 and the second light emitting area 1200, the third wires 13 (such as 13A and 13B shown) may connect the second electrodes of the plurality of third organic light emitting diodes located in the first light emitting area 1100 and the second light emitting area 1200, and the fourth wires 14 (such as 14A and 14B shown) may connect the second electrodes of the plurality of fourth organic light emitting diodes located in the first light emitting area 1100 and the second light emitting area 1200.

Figure 4:
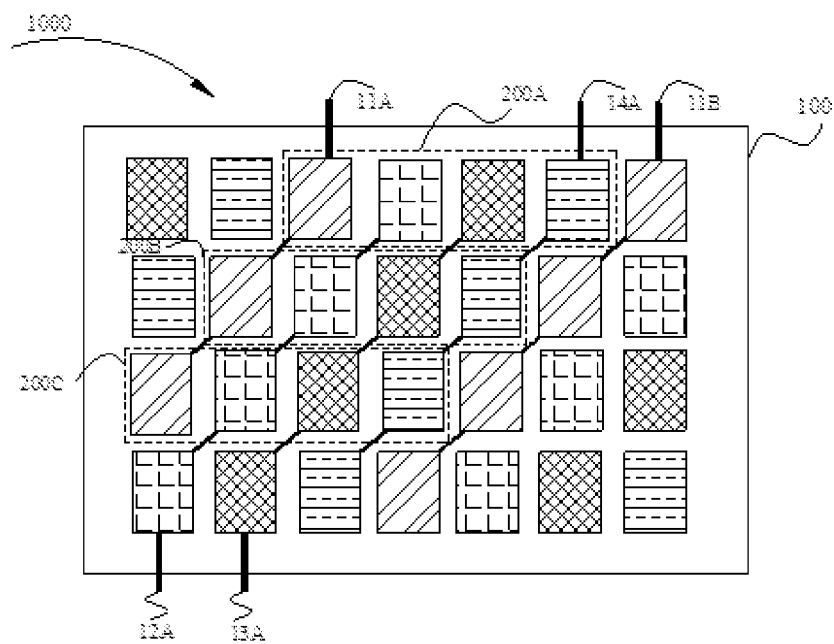
FIG. 4 shows a partial structural diagram of an organic light emitting diode panel according to another embodiment of the present disclosure, which includes a plurality of organic light emitting units arranged in an array, wherein each of the light emitting units includes organic light emitting diodes of different emission colors.

Alternatively, according to the embodiments of the present disclosure, referring to FIG. 4, the panel may include a plurality of same light emitting units. Each light emitting unit 200 includes a plurality of organic light emitting diodes of different emission colors. In other words, a single light emitting unit does not include organic light emitting diodes of the same emission color, that is, the light emitting unit is a smallest repeated unit of an arrangement of the organic light emitting diodes, and the number, emission colors and order of the organic light emitting diodes in each light emitting unit are the same. The plurality of light emitting units are arranged in multiple rows or multiple columns on the substrate 100. Alternatively, referring to FIG. 4, a plurality of light emitting units (such as light emitting units 200A, 200B and 200C shown) are arranged in an array on the substrate 100. When the plurality of light emitting units are arranged in an array on the substrate 100, two light emitting units located in two adjacent rows (or columns) are staggered by one light emitting diode in a row direction. This is beneficial to simplify the wire arrangement. Referring to FIG. 4, the second electrodes of the organic light emitting diodes of the same emission color in the plurality of light emitting units may be connected in series by using an inclined wire between two adjacent rows of the organic light emitting diodes. Then, the second electrodes of the plurality of organic light emitting diodes of the same emission color are connected together by using the first wires 11, the second wires 12, the third wires 13 and the fourth wires 14 shown. For example, the plurality of light emitting diodes of the same emission color may be connected to the same connection port by using the first wires 11A and 11B. In this way, it is possible to simply control simultaneous turn-on or turn-off of the plurality of organic light emitting diodes of the same emission color.

Alternatively, according to the embodiments of the present disclosure, a wire directly connected to the connection port may be provided at the second electrode of each organic light emitting diode. In other words, the second electrodes and the wires are connected in a one-to-one correspondence. This may prevent the case that when one of the plurality of organic light emitting diodes connected in series is damaged, the other organic light emitting diodes connected together in series all fail to emit light normally.

Figure 5:
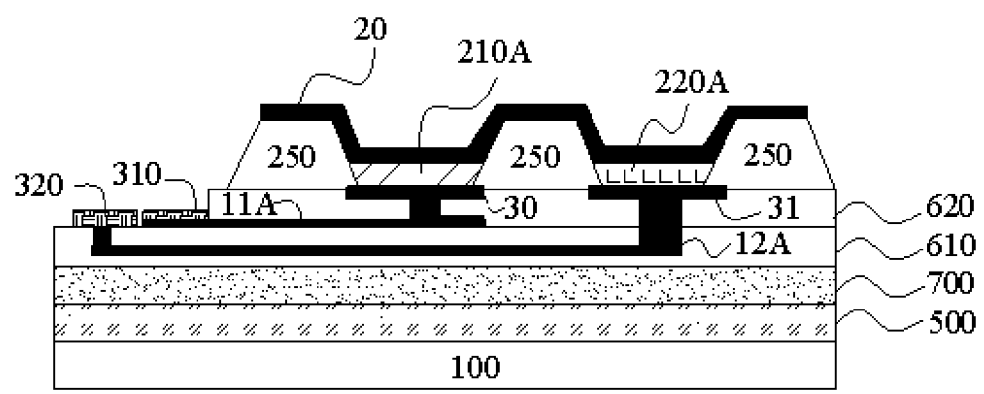
FIG. 5 shows a partial structural diagram of an organic light emitting diode panel according to another embodiment of the present disclosure, in which an interlayer structure is shown.

According to the embodiments of the present disclosure, in order to save the area occupied by the wires, referring to FIG. 5, a buffer layer may be provided between the substrate 100 and the organic light emitting diodes. For example, there may be at least two buffer layers, such as a first buffer layer 610 and a second buffer layer 620 shown. The plurality of wires, such as the first wire 11A and the second wire 12A shown, may be distributed in different buffer layers and connected to the second electrodes of the organic light emitting diodes through via holes. For example, the first wire 11A connected to a second electrode 30 of the first organic light emitting diode 210A may be located in the second buffer layer 620, and the second wire 12A connected to a second electrode 31 of the second organic light emitting diode 220A may be located in the first buffer layer 610. In this way, a double-layer or even multi-layer arrangement of multiple wires may be realized, so that the area occupied by the wires on the substrate 100 may be saved. Therefore, the light extraction efficiency of the organic light emitting diode panel may be further improved. At the edges of the substrate 100, the connection ports (such as the second connection port 310 and the third connection port 320 shown) may be exposed through strategies such as etching the buffer layers. Since the first electrodes of the plurality of organic light emitting diodes may be connected to the same connection port, a continuous common first electrode 20 may be prepared to serve as the first electrodes of the plurality of organic light emitting diodes. Those skilled in the art may understand that the organic light emitting diode panel may further include a structure such as a pixel defining layer 250.

According to the embodiments of the present disclosure, the organic light emitting diode panel may further include a scattering film 500. The scattering film 500 is located on a light exit side of the organic light emitting diode panel to scatter the light emitted by the plurality of organic light emitting diodes before the light is emitted out of the organic light emitting diode panel. The scattering film 500 may be a scattering film commonly used in a conventional lighting device, which may have a relatively low transparency and a relatively great roughness, thereby achieving a light mixing effect. The light emitted by the plurality of organic light emitting diodes is mixed and then emitted, so as to prevent a light emitting boundary of the plurality of organic light emitting diodes from being visible to users, thereby further improving the performance of the organic light emitting diode panel. Since the scattering film 500 generally has a relatively large roughness, in order to improve the bonding between other structures and the substrate 100 and ensure that the subsequent processes may proceed smoothly, a planarization layer 700 may be further provided between the scattering film 500 and the organic light emitting diodes.

In another aspect of the present disclosure, an OLED light emitting device is proposed. According to the embodiments of the present disclosure, the OLED light emitting device includes a housing and the above-described organic light emitting diode panel. The housing may include a frame and a transparent lampshade that define an accommodation space. The organic light emitting diode panel is housed in the accommodation space, and a light exit side of the organic light emitting diode panel is arranged toward the lampshade. The OLED light emitting device has all the features and advantages of the organic light emitting diode panel described above, which will not be repeated here. In general, the OLED light emitting device has at least one of the advantages of a simple structure, a light and thin volume, and a flexibly tunable emission color.

In the description of the present disclosure, the orientation or positional relationship indicated by the terms "upper," "lower" and others is based on the orientation or positional relationship shown in the drawings, which is only for the convenience of describing the present disclosure and does not require that the present disclosure must be configured and operated in a specific orientation, and should not therefore be understood as a limitation of the present disclosure.

In the description of the specification, the description with reference to the terms "one embodiment", "another embodiment", etc. means that the specific feature, structure, material or characteristic described in conjunction with the embodiments is included in at least one embodiment of the present disclosure. In the specification, the schematic representations of the above terms do not necessarily refer to the same embodiment or example. Moreover, the specific features, structures, materials or characteristics described may be combined in any one or more embodiments or examples in a suitable manner. In addition, those skilled in the art may combine the different embodiments or examples and the features of the different embodiments or examples described in the specification in case of no contradiction. In addition, it should be noted that the terms "first" and "second" are used for descriptive purposes and should not be understood as indicating or implying relative importance or implicitly indicating the number of indicated technical features.

Although the embodiments of the present disclosure have been shown and described above, it may be understood that the above embodiments are exemplary and should not be construed as limiting the present disclosure. Those ordinary skilled in the art may make changes, modifications, replacements and transformations on the above-described embodiments within the scope of the present disclosure.

What is claimed is:

1. An organic light emitting diode panel, comprising:
a substrate;
a plurality of organic light emitting diodes located on the substrate, wherein emission colors of the plurality of organic light emitting diodes are not completely the same, and each organic light emitting diode comprises a first electrode and a second electrode;
a plurality of wires; and
a plurality of connection ports,
wherein the same voltage is applied to the first electrodes of organic light emitting diodes of different emission colors, the same voltage is applied to the second electrodes of organic light emitting diodes of the same emission color, and different voltages are applied to the second electrodes of the organic light emitting diodes of different emission colors;
wherein the first electrode is a cathode of the organic light emitting diode, and the second electrode is an anode of the organic light emitting diode;
wherein the connection ports are located at an edge of the substrate and are directly connected to the first electrodes and the second electrodes of the organic light emitting diodes through the wires, so as to apply voltages to the first electrodes and the second electrodes of the organic light emitting diodes through the connection ports; and
wherein anodes of the organic light emitting diodes of the same emission color are connected to a same connection port, and anodes of the light emitting colors of different emission colors are connected to different connection ports.

2. The organic light emitting diode panel according to claim 1, wherein the second electrodes of the organic light emitting diodes of the same emission color are connected to a voltage controller through the same wire.

3. The organic light emitting diode panel according to claim 1, wherein the substrate is divided into a plurality of light emitting areas, and the second electrodes of a plurality of organic light emitting diodes located in the same light emitting area and having the same emission color are connected to a voltage controller through the same wire.

4. The organic light emitting diode panel according to claim 1, further comprising a plurality of wires connected to the second electrodes of the organic light emitting diodes, wherein the second electrodes and the wires are connected in a one-to-one correspondence.

5. The organic light emitting diode panel according to claim 1, comprising a plurality of light emitting units which are the same, each light emitting unit comprising multiple of the organic light emitting diodes which are located on the same straight line, and emission colors of which are not completely the same.

6. The organic light emitting diode panel according to claim 5, wherein the plurality of light emitting units are arranged in multiple rows or multiple columns on the substrate.

7. The organic light emitting diode panel according to claim 5, wherein the plurality of light emitting units are arranged in an array on the substrate, and the organic light emitting diodes of two of the light emitting units located in two adjacent rows are arranged by staggering one light emitting diode in a row direction.

8. The organic light emitting diode panel according to claim 1, further comprising:
a scattering film located on a light exit side of the organic light emitting diode panel.

9. The organic light emitting diode panel according to claim 1, wherein at least two buffer layers are provided between the substrate and the organic light emitting diodes, the plurality of wires are distributed in the at least two buffer layers and are respectively connected to the first electrodes and the second electrodes of the organic light emitting diodes through via holes.

10. The organic light emitting diode panel according to claim 8, wherein a planarization layer is provided between the scattering film and the organic light emitting diodes.

11. The organic light emitting diode panel according to claim 1, wherein the plurality of organic light emitting diodes have the same shape and are arranged in a row, and a shape of each organic light emitting diode is a rectangle with a long side perpendicular to an extending direction of the row, or is a parallelogram.

12. The organic light emitting diode panel according to claim 1, wherein the plurality of organic light emitting diodes have the same shape and are arranged in an array, and a shape of each organic light emitting diode is a rectangle, rhombus, triangle or circle.

13. An OLED light emitting device, comprising:
a housing comprising a frame and a transparent lampshade that define an accommodation space; and
the organic light emitting diode panel according to claim 1, wherein the organic light emitting diode panel is housed in the accommodation space, and a light exit side of the organic light emitting diode panel is arranged toward the lampshade.

14. The organic light emitting diode panel according to claim 2, further comprising:
a scattering film located on a light exit side of the organic light emitting diode panel.

15. The organic light emitting diode panel according to claim 3, further comprising:
a scattering film located on a light exit side of the organic light emitting diode panel.

16. The organic light emitting diode panel according to claim 4, further comprising:
a scattering film located on a light exit side of the organic light emitting diode panel.

17. The organic light emitting diode panel according to claim 5, further comprising:
a scattering film located on a light exit side of the organic light emitting diode panel.

18. The organic light emitting diode panel according to claim 6, further comprising:
a scattering film located on a light exit side of the organic light emitting diode panel.

* * * * *